(12) United States Patent
Sakamoto et al.

(10) Patent No.: US 6,838,327 B2
(45) Date of Patent: Jan. 4, 2005

(54) METHOD FOR MANUFACTURING SEMICONDUCTOR DEVICE HAVING INSULATING FILM WITH N—H BOND

(75) Inventors: Hiroki Sakamoto, Takatsuki (JP); Yasuhiro Kawasaki, Takatsuki (JP); Kenji Yoneda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/375,949

(22) Filed: Feb. 27, 2003

(65) Prior Publication Data

US 2003/0168707 A1 Sep. 11, 2003

(30) Foreign Application Priority Data

Mar. 11, 2002 (JP) ........................................ 2002-065844

(51) Int. Cl.[7] .......................................... H01L 21/8238
(52) U.S. Cl. ........................................ 438/199; 438/791
(58) Field of Search ............................... 438/197, 199, 438/744, 757, 791

(56) References Cited

U.S. PATENT DOCUMENTS

| 6,333,547 | B1 | * | 12/2001 | Tanaka et al. | ............... | 257/649 |
| 6,355,582 | B1 | | 3/2002 | Hosoda et al. | | |
| 2002/0024119 | A1 | | 2/2002 | Tanaka et al. | | |
| 2002/0055273 | A1 | | 5/2002 | Hasegawa | | |
| 2003/0222318 | A1 | * | 12/2003 | Tanaka et al. | ............... | 257/406 |

FOREIGN PATENT DOCUMENTS

| EP | 0 431 878 | 6/1991 |
| GB | 1184227 | 3/1970 |
| JP | 11-261059 | 9/1999 |
| JP | 2001-85426 | 3/2001 |

OTHER PUBLICATIONS

"Realization of High Performance Dual Gate DRMs without Boron Penetration by Application of Tetrachlorosilane Silicon Nitride Films", Tanaka M et al.; 2001 Symposium on VLSI Technology Digest of Technical Papers Kyoto, Japan, Jun. 12, 2001 pp. 123–124, XP010552030 ISBN: 4–89114–012–7.

* cited by examiner

*Primary Examiner*—Hoai Pham
(74) *Attorney, Agent, or Firm*—Merchant & Gould P.C.

(57) ABSTRACT

A semiconductor device includes a gate insulating film formed on a silicon substrate, a gate electrode formed on the gate insulating film, and an electrical insulating film formed on the gate electrode. The electrical insulating film includes a N—H bond and substantially no Si—H bond. The electrical insulating film is formed by using tetrachlorosilane ($SiCl_4$) that contains no hydrogen (H) as a source gas for a silicon nitride film. Thus, the semiconductor device can suppress residual hydrogen in the gate insulating film and prevent interface defects of the gate insulating film, a shift in the threshold voltage of a transistor, and the degradation of an on-state current. A method for manufacturing the semiconductor device also is provided.

6 Claims, 10 Drawing Sheets

METHOD FOR MANUFACTURING SEMICONDUCTOR DEVICE HAVING INSULATING FILM WITH N—H BOND

BACKGROUND OF THE INVENTION

1. Field of the Invention

The present invention relates to a semiconductor device and a method for manufacturing the semiconductor device. In particular, the present invention relates to a semiconductor device that includes a thin gate insulating film and a method for manufacturing the semiconductor device.

2. Description of the Related Art

In LSIs (large scale integrated circuits), miniaturization of the elements, i.e., MOSFETs (metal oxide semiconductor field effect transistors) and a decrease in operating voltage have been pursued to increase the degree of integration per chip. With the achievement of highly integrated elements, a polymetal gate that uses a tungsten film instead of a tungsten silicide film for word lines has been studied to improve the speed of the elements. The specific resistance of the tungsten film is even lower than that of the tungsten silicide film.

For example, JP 11(1999)-261059 A discloses a method for fabricating a single p-channel MOS (metal oxide semiconductor) transistor that includes a polymetal gate with a conventional LP-SiN (low pressure chemical vapor deposition silicon nitride) film by using a STI (shallow trench isolation) process. FIGS. 9A to 9D are cross-sectional views showing the method in order. First, shallow trenches for isolation (STI) 161 are formed in a substrate 141, and then an n well 151 is formed by ion implantation of phosphorus (P) and arsenic (As) into a region between the trenches (FIG. 9A).

A RTP (rapid thermal process) is performed to form a gate insulating film 11 of an oxide film or oxynitride film. Using a LPCVD (low pressure chemical vapor deposition) chamber, an amorphous Si film 12 is grown in a $SiH_4$ atmosphere, and then is doped with boron (B) by ion implantation. A titanium nitride (TiN) film 14 and a tungsten (W) film 15 are deposited in the order mentioned. A LP-SiN film 16 that serves as a gate-cap layer is formed on the tungsten film 15 in an atmosphere of $SiH_2Cl_2$ (dichlorosilane, which may be abbreviated as "DCS" in the following) and $NH_3$. On top of that, a photoresist pattern 17 is formed to provide a gate pattern (FIG. 9B). The boron-implanted amorphous Si film 12, the titanium nitride film 14, and the tungsten film 15 constitute a gate electrode 18 in the subsequent process.

By using the photoresist pattern 17 as a mask, etching is performed to form a polymetal gate (gate electrode) 18 (FIG. 9C).

A side wall 19 is formed with the LP-SiN film. The side wall 19 is used to provide a LDD (lightly doped drain), a source ($p^+$) 171, a drain ($p^+$) 172, etc. (FIG. 9D).

For the polymetal gate thus produced, however, a large amount of hydrogen (H) is included in a range from the surface of the gate cap layer 16 to a depth of about 125 nm (FIG. 10). In FIG. 10, the horizontal axis indicates a depth (nm) from the surface of the LP-SiN film 16 (the gate cap layer) shown in FIG. 9D, and the vertical axis indicates the hydrogen concentration (atoms/cm$^3$). The LP-SiN film 16 is formed of a $SiH_2Cl_2$ gas including a Si—H bond and a $NH_3$ gas including a N—H bond. Therefore, unreacted Si—H and N—H bonds remain in the silicon nitride film, so that a large amount of hydrogen (H) is entrapped. The unreacted Si—H and N—H bonds are separated by various heat treatments after the deposition of LP-SiN to generate hydrogen. This hydrogen diffuses into the gate insulating film and acts as an electron trap, causing a shift in the threshold voltage (Vth) of a MOSFET and the degradation of an on-state current (Ion).

SUMMARY OF THE INVENTION

Therefore, with the foregoing in mind, it is an object of the present invention to provide a semiconductor device that can suppress the diffusion of a large amount of hydrogen (H) into a gate insulating film and prevent a shift in the threshold voltage of a transistor and the degradation of an on-state current, and a method for manufacturing the semiconductor device.

A semiconductor device of the present invention includes a gate insulating film formed on a silicon substrate, a gate electrode formed on the gate insulating film, and an electrical insulating film formed on the gate electrode. The electrical insulating film includes a N—H bond and substantially no Si—H bond.

The electrical insulating film that includes substantially no Si—H bond is defined as not having a peak of Si—H stretching in a wave number range of 2100 to 2500 cm$^{-1}$ measured by a Fourier transform infrared spectrometer (FT-IR), or even if the film has the Si—H stretching peak, the peak is negligibly minute amount.

A method for manufacturing a semiconductor device includes forming a gate insulating film on a silicon substrate, forming a gate electrode on the gate insulating film, and forming an electrical insulating film on the gate electrode. The electrical insulating film is formed so as to include a N—H bond and substantially no Si—H bond by decomposition and deposition of a mixture of a gas including substantially no Si—H bond and a gas including a N—H bond.

DESCRIPTION OF THE PREFERRED EMBODIMENTS

Figure 1A:
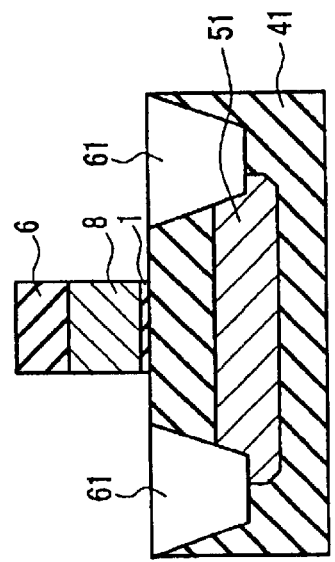
FIGS. 1A to 1D are cross-sectional views showing the processes of a method for manufacturing a semiconductor device of Embodiment 1 of the present invention.

In a semiconductor device of the present invention, an electrical insulating film (also referred to as "insulating film" in the following) is formed as a layer that includes a N—H bond and substantially no Si—H bond. The electrical insulating film is deposited on a gate electrode formed on a gate insulating film. The layer that includes a N—H bond and substantially no Si—H bond is, e.g., a silicon nitride film. Specifically, when analyzed by FT-IR measurement, the layer has a peak of N—H stretching in a wave number range of 3000 to 3500 $cm^{-1}$ and has no peak or a negligibly minute amount of peak of Si—H stretching in a wave number range of 2100 to 2500 $cm^{-1}$.

It is preferable that the insulating film is a deposited film obtained by the decomposition of a mixture of a gas including substantially no Si—H bond and a gas including a N—H bond.

It is preferable that the gas including substantially no Si—H bond is a tetrachlorosilane gas, and the gas including a N—H bond is at least one gas selected from the group consisting of ammonia, dimethylamine, hydrazine, and dimethylhydrazine.

The thickness of the insulating film is preferably 50 nm to 300 nm, and more preferably 100 nm to 200 nm.

It is preferable that the gate electrode includes a polysilicon film implanted with boron ions, a metal film, or a laminated structure of a polysilicon film and a metal film.

The present invention can provide a semiconductor device that uses an insulating film including substantially no Si—H bond (e.g., a silicon nitride film) as a cap film for a polymetal gate. Moreover, a gas including substantially no Si—H bond, e.g., tetrachlorosilane ($SiCl_4$, which may be abbreviated as "TCS" in the following) is used as a source gas for forming a silicon nitride film, thereby reducing a Si—H bond in the silicon nitride film. Thus, less hydrogen is separated by various heat treatments after the deposition of the silicon nitride film. Even if hydrogen diffuses into the gate insulating film, it is possible to prevent the insulating film (e.g., a silicon nitride film) from acting as an electron trap that causes a shift in the threshold voltage (Vth) of a MOSFET and the degradation of a on-state current (Ion).

A second method for manufacturing a semiconductor device of the present invention includes forming a gate insulating film on a silicon substrate, forming a gate electrode on the gate insulating film, and forming a silicon nitride film on the gate electrode by deposition of a source gas. The source gas may be a mixture of at least one gas selected from the group consisting of monosilane, dichlorosilane, and trichlorosilane and at least one gas selected from the group consisting of ammonia, dimethylamine, hydrazine, and dimethylhydrazine. It is preferable that the silicon nitride film is formed at temperatures of 750° C. to 800° C.

In this manufacturing method, it is preferable that annealing is performed after the formation of the silicon nitride film so that the annealing temperature is higher than the temperature at which the silicon nitride film is formed.

A third method for manufacturing a third semiconductor device of the present invention includes forming a gate insulating film on a silicon substrate, forming a gate electrode on the gate insulating film, and forming a silicon nitride film on the gate electrode by deposition of a source gas. The source gas may be a mixture of at least one gas selected from the group consisting of monosilane, dichlorosilane, and trichlorosilane and at least one gas selected from the group consisting of ammonia, dimethylamine, hydrazine, and dimethylhydrazine. It is preferable that annealing is performed after the formation of the silicon nitride film so that the annealing temperature is higher than the temperature at which the silicon nitride film is formed.

It is preferable that the annealing temperature is 800° C. to 1200° C., and that the annealing is performed in an atmosphere containing an inert gas, and further that the annealing is performed in an atmosphere of reduced pressure.

In the second and the third method, it is preferable that the gate electrode includes a polysilicon film implanted with boron ions, a metal film, or a laminated structure of a polysilicon film and a metal film.

The present invention allows annealing to be performed at temperatures higher than the deposition temperature of a source gas. Therefore, even if dichlorosilane ($SiH_2Cl_2$) or the like is used as the source gas for forming a silicon nitride film (a cap film for a polymetal gate), an unreacted Si—H bond in the silicon nitride film is reduced. The annealing in an atmosphere of reduced pressure and a nitrogen gas or inert gas such as Ar particularly can reduce the unreacted Si—H bond. Thus, less hydrogen is separated by various heat treatments after the deposition of the silicon nitride film. This makes it possible to prevent hydrogen from diffusing into the gate insulating film, acting as an electron trap, and causing a shift in the threshold voltage (Vth) of a MOSFET and the degradation of a on-state current (Ion).

The present invention can provide a semiconductor device that is provided with a gate cap insulating film including substantially no Si—H bond or a semiconductor device that uses a silicon nitride film including fewer Si—H and N—H bonds as a gate gap insulating film. Therefore, the diffusion of hydrogen into the polymetal gate electrode and the gate insulating film can be suppressed to prevent a shift in the threshold voltage of a transistor and the degradation of an on-state current.

Hereinafter, specific embodiments of the present invention will be described with reference to the drawings.

Embodiment 1

FIGS. 1A to 1D are cross-sectional views showing processes for forming a gate cap insulating film of a semiconductor device in order, according to Embodiment 1 of the present invention. FIGS. 1A to 1D illustrate an example of the fabrication of a single n-channel MOS transistor on a p-type silicon substrate using a STI process. Instead of the STI process, e.g., LOCOS (local oxidation of silicon) may be employed to form a region for isolating elements.

First, shallow trenches for isolation (STI) 61 are formed in a silicon substrate 41. The trenches 61 are produced by dry etching. Then, an n well 51 is formed by ion implantation of phosphorus (P) and arsenic (As) into a region between the trenches (FIG. 1A).

A RTP (rapid thermal process) is performed in an atmosphere of oxygen or nitrogen to form a gate insulating film 1 having a thickness of about 2.5 nm. The gate insulating film 1 is made of an oxide film or oxynitride film.

Using a LPCVD chamber, an amorphous Si film 2 is grown to have a thickness of about 80 nm in a $SiH_4$ atmosphere, which then is doped with boron (B) by ion implantation. A titanium nitride (TiN) film 4 having a thickness of about 10 nm and a tungsten (W) film 5 having a thickness of about 50 nm are deposited in the order mentioned. A LP-SiN film 6 (a gate cap layer) having a thickness of about 150 nm is formed on the tungsten film 5 in a mixed atmosphere of tetrachlorosilane ($SiCl_4$) and ammonia ($NH_3$) at 760° C.

Figure 1B:
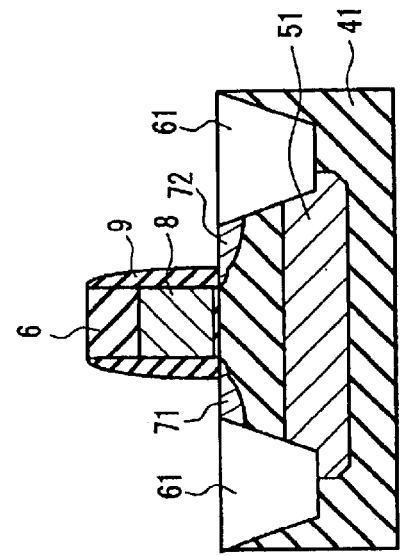

A photoresist pattern 7 is formed to provide a gate pattern (FIG. 1B). The boron-implanted amorphous Si film 2, the titanium nitride (TiN) film 4, and the tungsten (W) film 5 constitute a gate electrode 8 in the subsequent process.

Figure 1C:
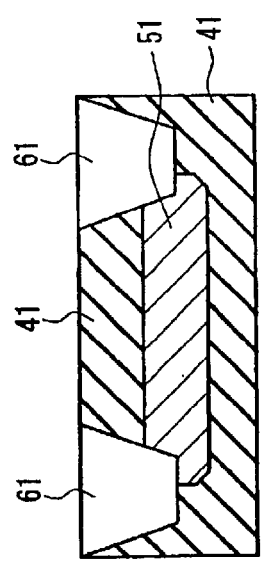

By using the photoresist pattern 7 as a mask, etching is performed to form a polymetal gate (gate electrode) 8 (FIG. 1C).

Figure 1D:
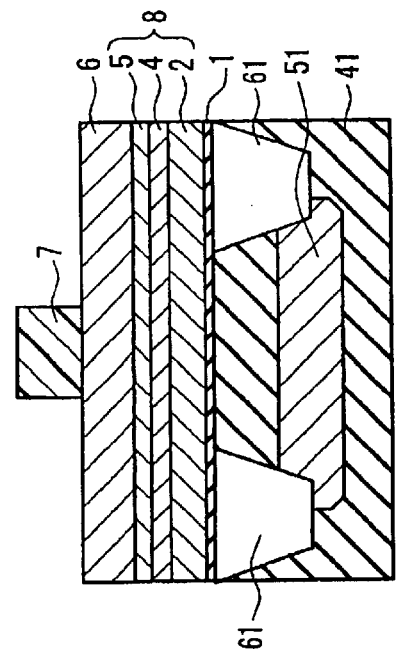

Next, a side wall 9 having a thickness of about 120 nm is formed with the LP-SiN film. The side wall 9 is used to provide a LDD (lightly doped drain) structure, a source ($p^+$) 71, and a drain ($p^+$) 72, etc. (FIG. 1D).

The temperature at which the LP-SiN film 6 is formed ranges from 500° C. to 800° C., and preferably 700° C. to 800° C. Temperatures of not less than 500° C. can reduce hydrogen in the silicon nitride film, and temperatures of not more than 800° C. can ensure the heat resistance of the gate electrode.

In this embodiment, a gas mixture of tetrachlorosilane and ammonia is used as a source gas for forming the film. The source gas is not particularly limited as long as it includes substantially no Si—H bond, and can be a mixture of a tetrachlorosilane gas and a gas including a N—H bond. The deposition of this source gas results in a silicon nitride film that includes substantially no Si—H bond.

The gas including a N—H bond can be, e.g., ammonia, lower amine such as monomethylamine ($NH_2CH_3$), hydrazine ($N_2H_4$), and a derivative of these compounds such as dimethylamine ($NH(CH_3)_2$) and dimethylhydrazine ($CH_3NHNHCH_3$).

Figure 2:
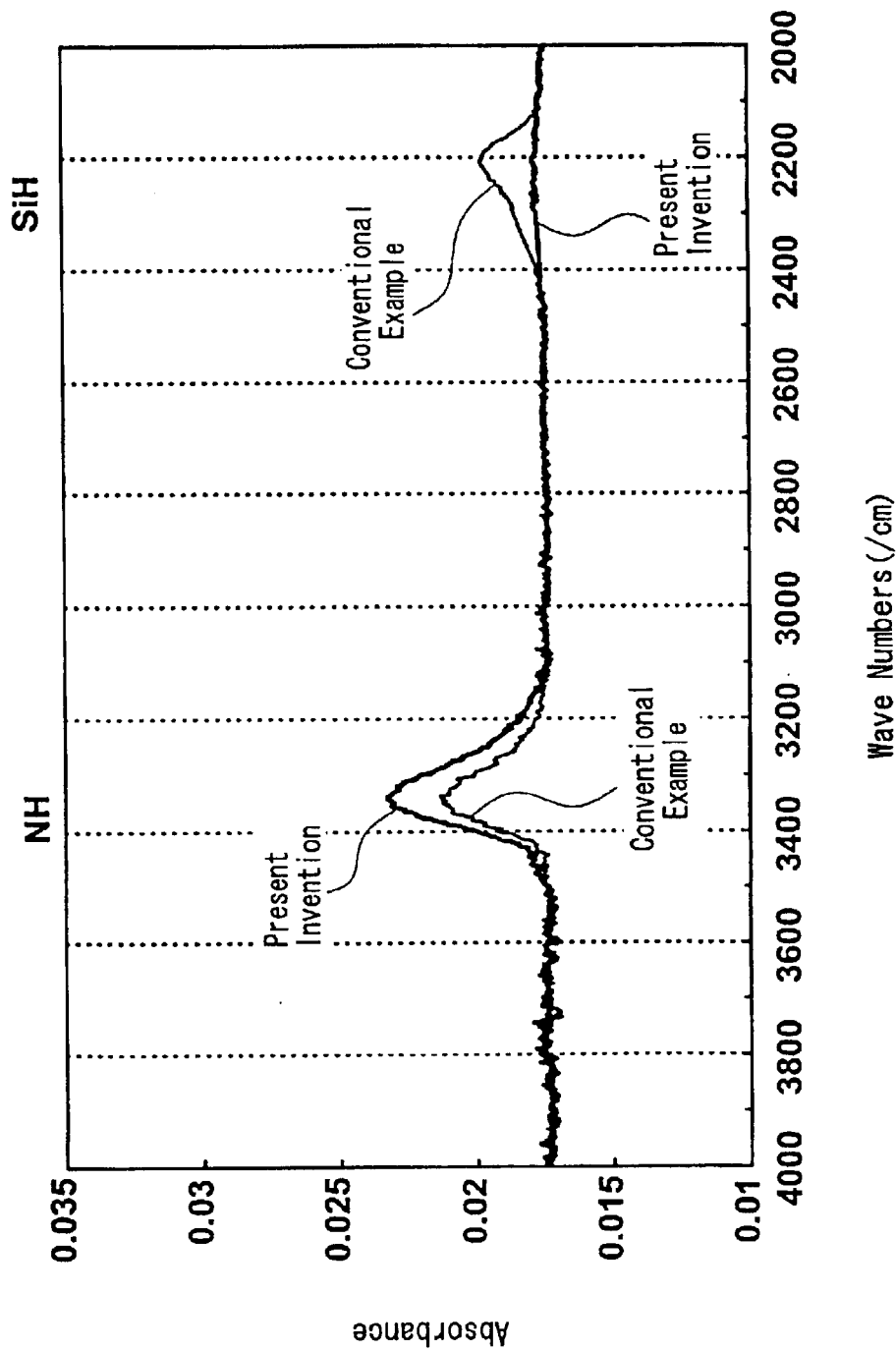
FIG. 2 is a graph showing a hydrogen bond in silicon nitride films, which is measured by a Fourier transform infrared spectrometer (FT-IR). The silicon nitride films are produced respectively by a method of Embodiment 1 of the present invention and a conventional method.

The LP-SiN films 6 were produced respectively by a method of this embodiment and a conventional method. Then, a hydrogen bond in each of the silicon nitride films was measured by a Fourier transform infrared spectrometer (FT-IR). FIG. 2 is a graph showing the results. The horizontal axis indicates the wave numbers, and the vertical axis indicates the absorbance. The silicon nitride film 6 of the present invention used a source gas of TCS ($SiCl_4$), while the conventional film used a source gas of DCS ($SiH_2Cl_2$). As shown in FIG. 2, both the silicon nitride films 6 of the present invention and the conventional example had a peak of N—H stretching (ranging from 3000 to 3500 $cm^{-1}$). However, only the conventional film formed of DCS had a peak of Si—H stretching (ranging from 2100 to 2500 $cm^{-1}$). Compared with DCS ($SiH_2Cl_2$) and TCS ($SiCl_4$), this is attributed to a Si—H bond in the molecular structure of DCS. Moreover, the bond energy of the Si—H bond is lower than that of the N—H bond, and thus the Si—H bond breaks easily. Consequently, the hydrogen separated from the Si—H bond may diffuse into the gate insulating film 1, causing a shift in the threshold voltage (Vth) and the degradation of an on-state current (Ion).

Figure 3:
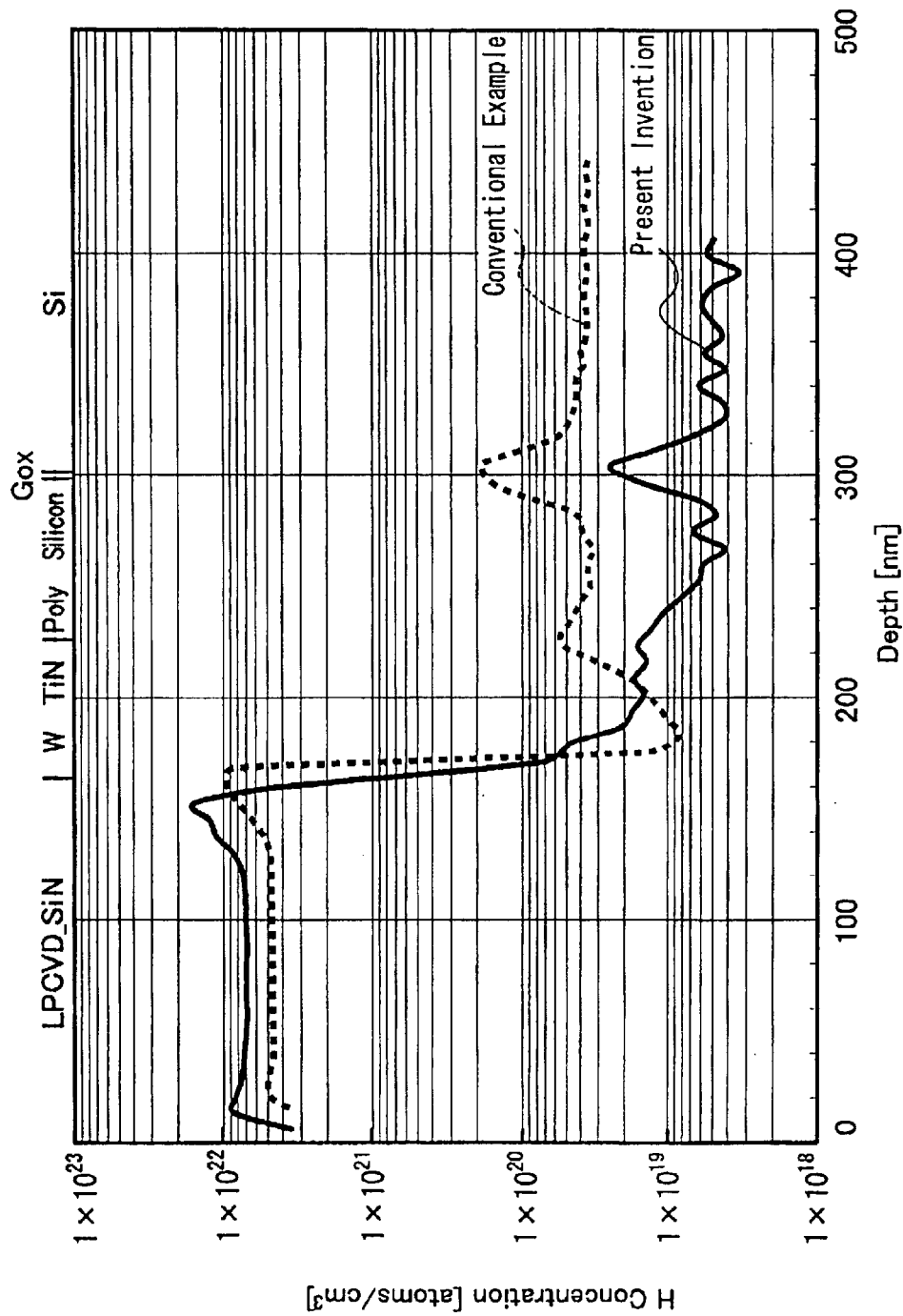
FIG. 3 is a graph showing the hydrogen distribution of silicon nitride films having a polymetal gate structure, which is measured by a secondary ion mass spectrometer (SIMS). The silicon nitride films are produced respectively by a method of Embodiment 1 of the present invention and a conventional method.

FIG. 3 is a graph showing the hydrogen distribution of the LP-SiN films 6 having a polymetal gate structure, which were produced respectively by a method of this embodiment and a conventional method. The horizontal axis indicates a depth (nm) from the surface of the LP-SiN film 6, and the vertical axis indicates the hydrogen concentration (atoms/$cm^3$). The hydrogen concentration was measured by a secondary ion mass spectrometer (SIMS).

As shown in FIG. 3, the amount of hydrogen (H) in the vicinity of the interface between the gate insulating film 1 and the polymetal gate electrode 8 (i.e., the portion indicated by Gox in FIG. 3) is made smaller for this embodiment (using a source gas of TCS) than for the conventional example (using a source gas of DCS). This result shows that hydrogen that has been separated from the Si—H bond diffuses into the gate insulating film 1.

Figure 4:
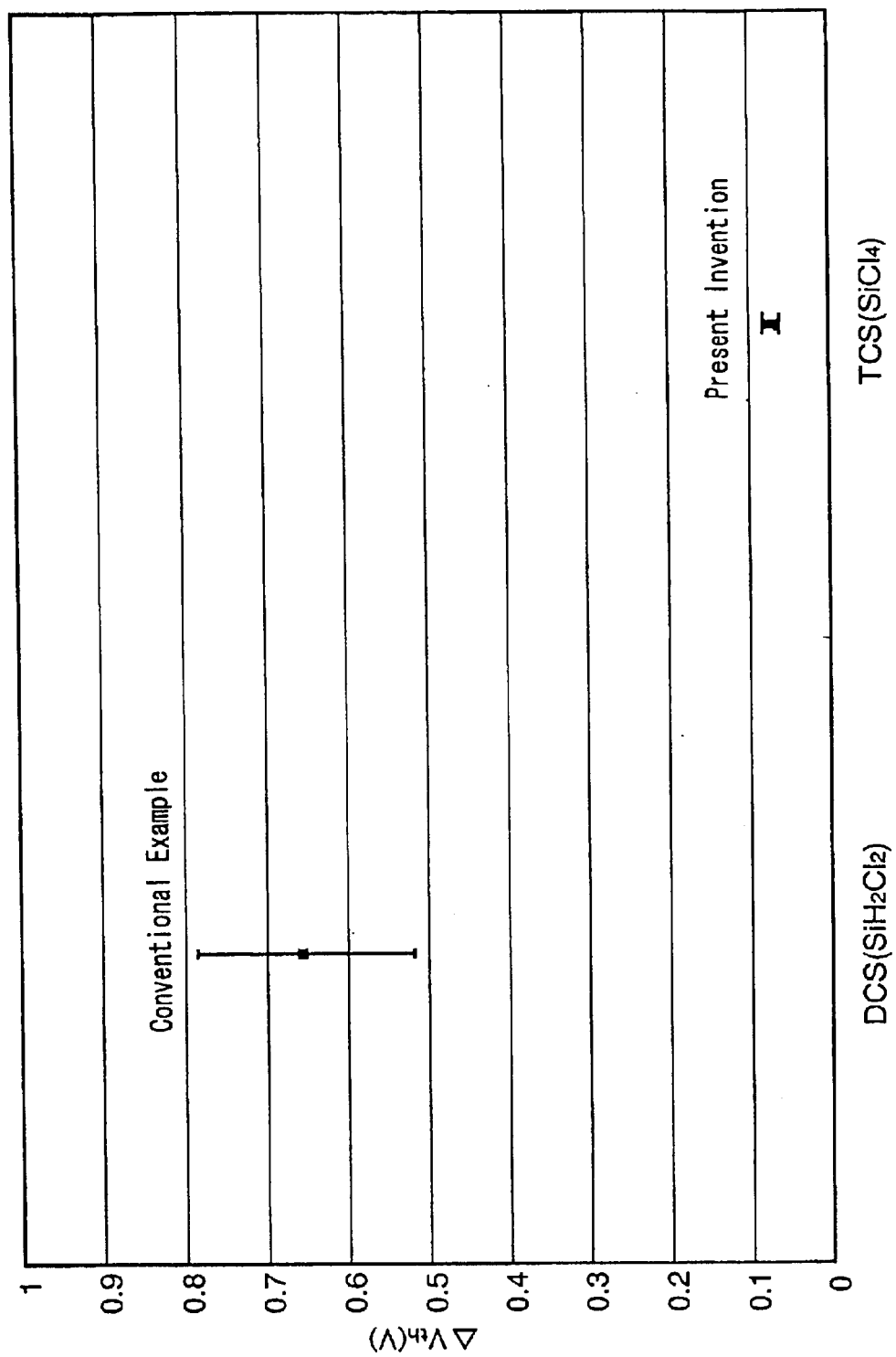
FIG. 4 is a graph showing a shift in the threshold voltage (Vth) of semiconductor devices that are manufactured respectively by a method of Embodiment 1 of the present invention and a conventional method.

FIG. 4 is a graph showing a shift in the threshold voltage (Vth) of semiconductor devices, which were manufactured respectively by a method of this embodiment (a source gas: TCS, and a film forming temperature: 760° C.) and a conventional method (a source gas: DCS, and a film forming temperature: 700° C.). The horizontal axis indicates the type of source gas, and the vertical axis indicates the amount of shift in Vth. FIG. 4 shows that the silicon nitride film of this embodiment can suppress a shift in the threshold voltage (Vth).

The silicon nitride film ($Si_3N_4$) 6 formed according to this embodiment as an insulating film on the polymetal gate 8 can suppress a shift in the threshold voltage (Vth), which has been prominent in a conventional silicon nitride film. This is because the amount of hydrogen in the film can be reduced by using a gas that contains no hydrogen, i.e., tetrachlorosilane ($SiCl_4$), thus eliminating the cause of an electron trap. Moreover, hydrogen (H) usually is joined to a dangling bond generated in the manufacturing process of a semiconductor. In this embodiment, however, the dangling bond can be terminated by halogen such as chlorine (Cl) instead of hydrogen (H).

As described above, the silicon nitride film 6 of this embodiment is formed by using tetrachlorosilane ($SiCl_4$) as a source gas, thereby effectively preventing the diffusion of hydrogen (H) into the gate insulating film.

Embodiment 2

FIGS. 5A to 5D are cross-sectional views showing processes for forming a gate cap insulating film of a semiconductor device in order, according to Embodiment 2 of the present invention. FIGS. 5A to 5D illustrate an example of the fabrication of a single n-channel MOS transistor on a p-type silicon substrate using a STI process. Instead of the STI process, e.g., LOCOS may be employed to form a region for isolating elements.

Figure 5A:
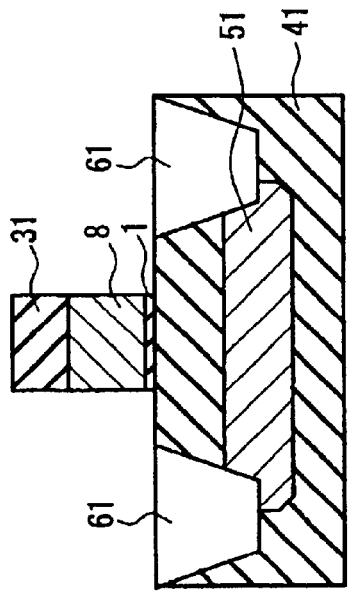
FIGS. 5A to 5D are cross-sectional views showing the processes of a method for manufacturing a semiconductor device of Embodiment 2 of the present invention.

First, like FIG. 1A, shallow trenches for isolation (STI) 61 are formed, and then an n well 51 is formed by ion implantation of phosphorous (P) and arsenic (As) into a region between the trenches (FIG. 5A).

Figure 5B:
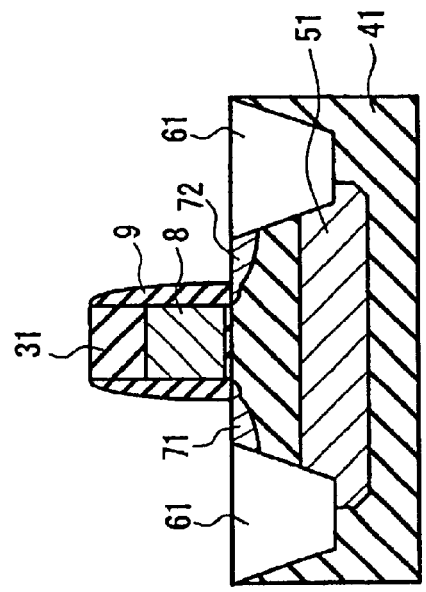

A RTP (rapid thermal process) is performed to form a gate insulating film 1 of an oxide film or oxynitride film. Using a LPCVD chamber, an amorphous Si film 2 is grown in a $SiH_4$ atmosphere, which then is doped with boron (B) by ion implantation. A titanium nitride (TiN) film 4 and a tungsten (W) film 5 are deposited in the order mentioned. A LP-SiN film 31 (a gate-cap layer) is formed on the tungsten film 5 in a mixed atmosphere of dichlorosilane ($SiH_2Cl_2$) and ammonia ($NH_3$) at 700° (in a conventional method) or 760° C. The silicon nitride film 31 is annealed for 60 minutes under the conditions of a nitrogen atmosphere, 102 to 105 Pa, and 800° C. Subsequently, a photoresist pattern 7 is formed to provide a gate pattern (FIG. 5B).

Figure 5C:
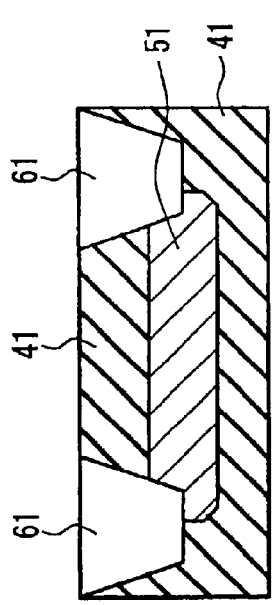

By using the photoresist pattern 7 as a mask, etching is performed to form a polymetal gate 8 (FIG. 5C).

Figure 5D:
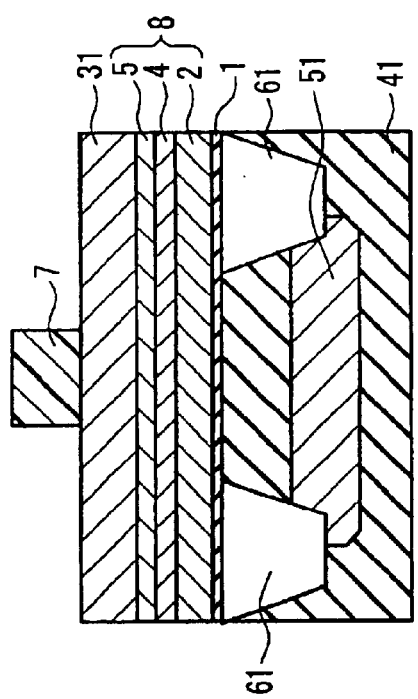

Next, a side wall 9 is formed with the LP-SiN film 31. The side wall 9 is used to provide a LDD (lightly doped drain) structure, a source (p+) 71, a drain (p+) 72, etc. (FIG. 5D).

The temperature at which the LP-SiN film 31 is formed ranges from 500° C. to 800° C., preferably 700° C. to 800° C., and more preferably 750° C. to 800° C. Temperatures of not less than 700° C. can reduce the residual hydrogen in the silicon nitride film, and temperatures of not more than 800° C. can ensure the heat resistance of the gate electrode.

In this embodiment, a gas mixture of dichlorosilane and ammonia is used as a source gas for forming the film. The dichlorosilane may be replaced, e.g., by monosilane, trichlorosilane, etc. Thus, the source gas can be a mixture of the above silane gas and a gas including a N—H bond.

The gas including a N—H bond can be, e.g., ammonia, lower amine such as monomethylamine ($NH_2CH_3$), hydrazine ($N_2H_4$), and a derivative of these compounds such as dimethylamine ($NH(CH_3)_2$) and dimethylhydrazine ($CH_3NHNHCH_3$).

The annealing temperature is higher than the temperature at which the silicon nitride film is formed, and desirably not less than 800° C. The annealing temperature of not less than 800° C. can eliminate the residual hydrogen in the silicon nitride film. It is preferable that the annealing temperature is not more than 1200° C. in view of the heat resistance of the gate electrode. The annealing time generally is 5 to 120 minutes, and preferably 30 to 60 minutes. Considering the film characteristics of the silicon nitride film, the annealing should be performed in an inert gas atmosphere. Examples of the inert gas include a low reactive gas such as a nitrogen gas and a rare gas such as Ar. Although the annealing can be performed at atmospheric pressure or reduced pressure, an atmosphere of reduced pressure is preferred for reducing an unreacted Si—H bond.

Figure 6A:
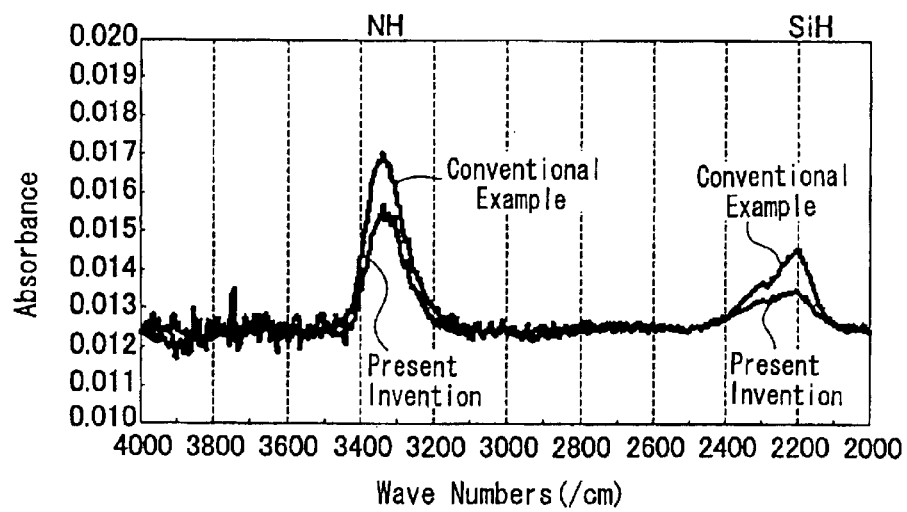
FIGS. 6A and 6B are graphs, each showing a hydrogen bond in silicon nitride films, which is measured by a FT-IR. The silicon nitride films are produced respectively by a method of Embodiment 2 of the present invention and a conventional method.
Figure 6B:
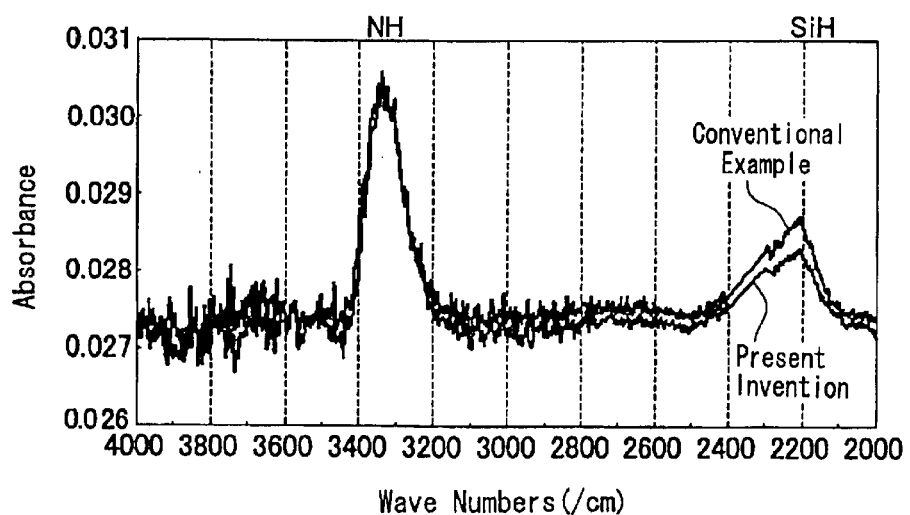

The LP-SiN films 31 were produced respectively by a method of this embodiment and a conventional method. Then, a hydrogen bond in each of the silicon nitride films was measured by a FT-IR. FIGS. 6A and 6B are graphs showing the results. The horizontal axis indicates the wave numbers, and the vertical axis indicates the absorbance. In FIG. 6A, both the silicon nitride films of this embodiment and the conventional example were formed by depositing DCS at 700° C. However, they differed in subsequent process, that is, the silicon nitride film of this embodiment was annealed in a nitrogen atmosphere at 800° C. for 60 minutes, while the conventional film was not annealed. In FIG. 6B, the silicon nitride film of this embodiment was formed by depositing DCS at 760° C., and the conventional film was formed by depositing DCS at 700° C. In this case, neither of the silicon nitride films was annealed.

As shown in FIG. 6A, the peak of N—H stretching (ranging from 3000 to 3500 $cm^{-1}$) and the peak of Si—H stretching (ranging from 2100 to 2500 $cm^{-1}$) of the silicon nitride film that has been annealed at temperatures higher than the film forming temperature are made lower than those of the unannealed film.

As shown in FIG. 6B, the peak of N—H stretching (ranging from 3000 to 3500 $cm^{-1}$) and the peak of Si—H stretching (raging from 2100 to 2500 $cm^{-1}$) are higher than those shown in FIG. 6A. These results show that the N—H bond and the Si—H bond are reduced by forming the silicon nitride film at higher temperatures. The reason for this is considered to be as follows: the film forming temperature is increased from 700° C. (the conventional example) to 760° C., and the annealing is performed at temperatures (800° C.) higher than the film forming temperature, so that the residual Si—H and N—H bonds in the silicon nitride film are broken to cause the diffusion of hydrogen from the silicon nitride film.

Figure 7A:
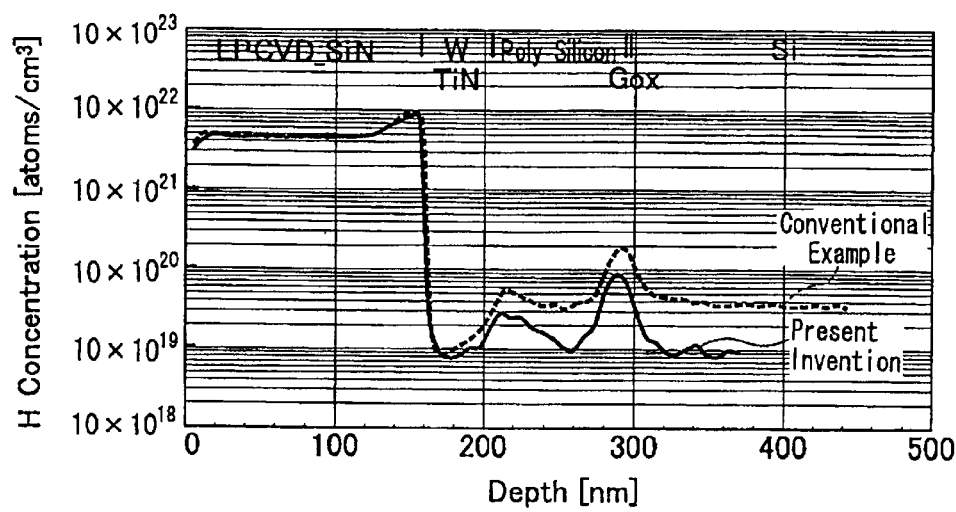
FIGS. 7A and 7B are graphs, each showing the hydrogen distribution of silicon nitride films having a polymetal gate structure, which is measured by a SIMS. The silicon nitride films are produced respectively by a method of Embodiment 2 of the present invention and a conventional method.
Figure 7B:
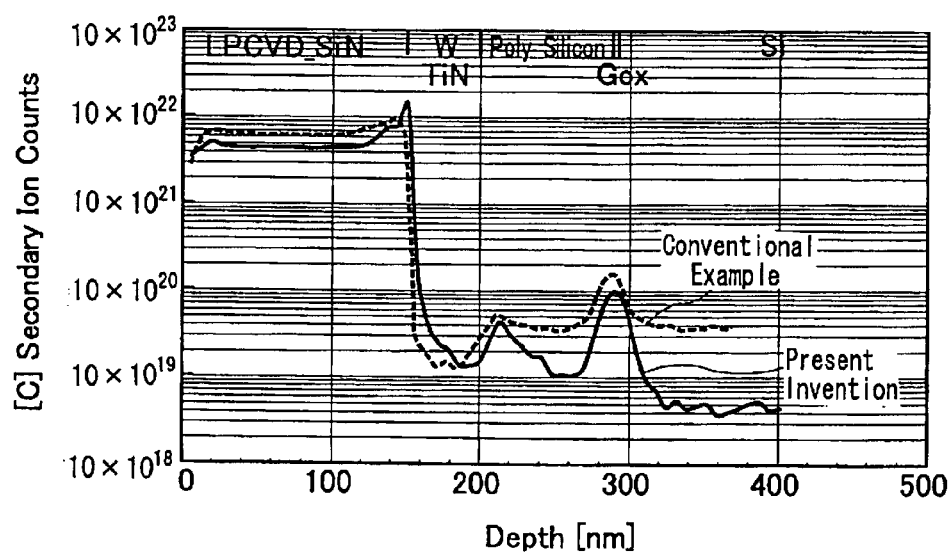

FIGS. 7A to 7B are graphs showing the hydrogen distribution of the LP-SiN films 31 having a polymetal gate structure, which were produced respectively by a method of this embodiment and a conventional method. The horizontal axis indicates a depth (nm) from the surface of the LP-SiN film 31, and the vertical axis indicates hydrogen concentration (atoms/$cm^3$). The hydrogen concentration was measured by a SIMS.

In FIG. 7A, both the silicon nitride films of this embodiment and the conventional example were formed by depositing DCS at 700° C. However, they differed in subsequent process, that is, the silicon nitride film of this embodiment was annealed in a nitrogen atmosphere at 800° C., while the conventional film was not annealed. In FIG. 7B, the silicon nitride film of this embodiment was formed by depositing DCS at 760° C., and the conventional film was formed by depositing DCS at 700° C. In this case, neither of the silicon nitride films was annealed.

As shown in FIG. 7A, the amount of hydrogen (H) in the vicinity of the interface between the gate insulating film 1 and the polymetal gate electrode 8 is reduced by annealing the silicon nitride film at temperatures (e.g., 800° C.) higher than the film forming temperature when compared to the unannealed film.

As shown in FIG. 7B, the amount of hydrogen (H) in the vicinity of the interface between the gate insulating film 1 and the polymetal gate electrode 8 is reduced by increasing the film forming temperature from 700° C. (the conventional example) to 760° C.

Figure 8:
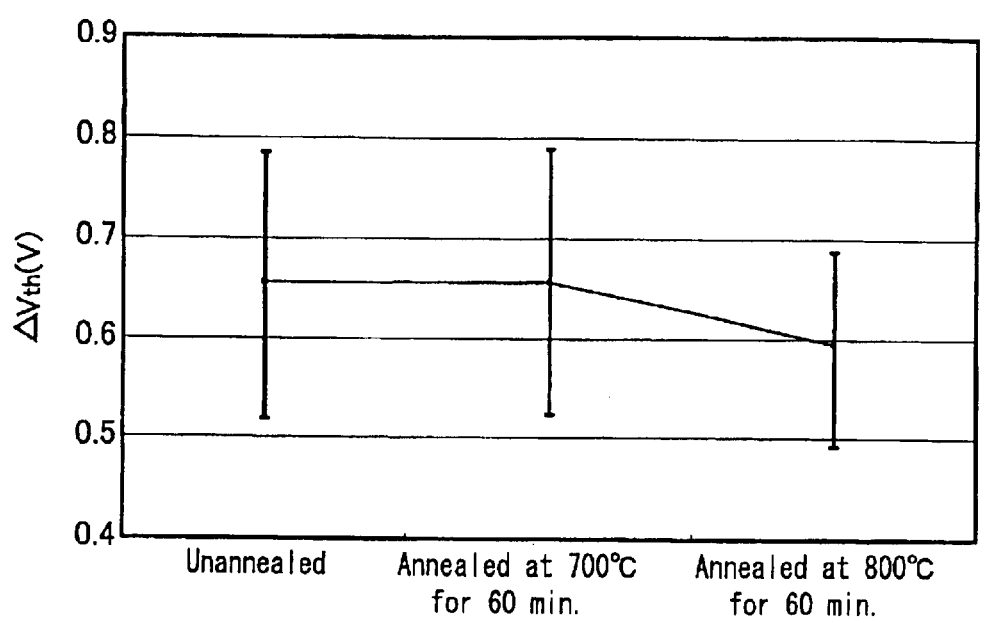
FIG. 8 is a graph showing a shift in the threshold voltage (Vth) of semiconductor devices that are manufactured respectively by a method of Embodiment 2 of the present invention and a conventional method.
Figure 9C:
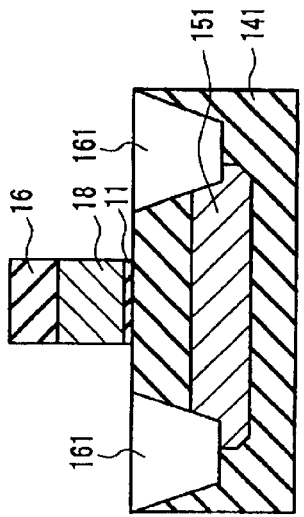
FIGS. 9A to 9D are cross-sectional views showing the processes of a method for manufacturing a conventional semiconductor device including a polymetal gate.
Figure 9D:
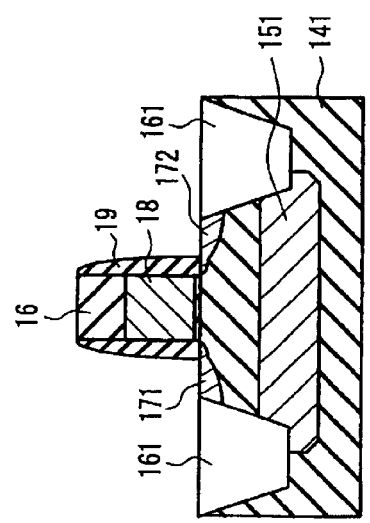
Figure 9A:
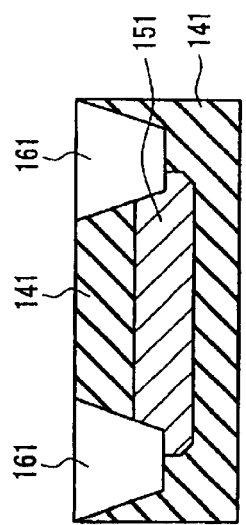
Figure 9B:
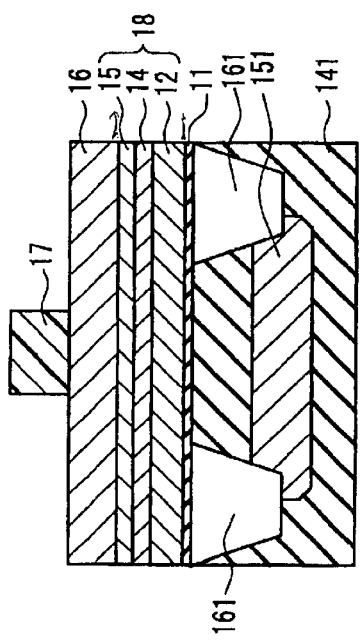
Figure 10:
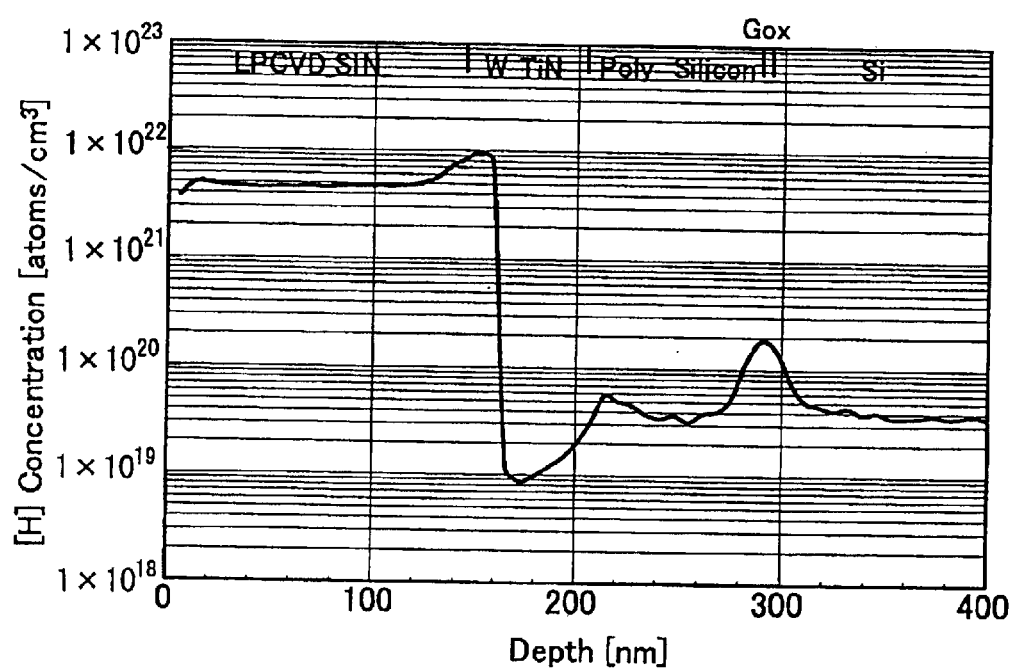
FIG. 10 is a graph showing the hydrogen distribution of a conventional silicon nitride film having a polymetal gate structure, which is measured by a SIMS.

FIG. 8 is a graph showing a shift in the threshold voltage (Vth) of semiconductor devices, which were manufactured respectively by a method of this embodiment (a film forming temperature: 700° C., and annealing at 800° C. for 60 min.), a first comparative method (a film forming temperature: 700° C., and without annealing), and a second comparative method (a film forming temperature: 700° C., and annealing at 700° C. for 60 min.). The horizontal axis indicates the conditions of annealing, and the vertical axis indicates the amount of shift in Vth. FIG. 8 shows that the silicon nitride film that is annealed at 800° C. can suppress a shift in the threshold voltage (Vth).

The silicon nitride film ($Si_3N_4$) 31 formed according to this embodiment as an insulating film on the polymetal gate 8 can suppress a shift in the threshold voltage (Vth), which has been prominent in a conventional silicon nitride film. This is because the amount of hydrogen in the film can be reduced by increasing the film forming temperature compared with the conventional method and annealing the silicon nitride film desirably at temperatures higher than the film forming temperature, thus eliminating the cause of an electron trap.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a semiconductor device comprising:

forming a gate insulating film on a silicon substrate;

forming a deposited film comprising a polysilicon film, a metal film, or laminated structure of polysilicon film and a metal film on the gate insulating film;

forming a gate cap insulating film on the deposited film;

forming a photoresist pattern on the gate cap insulating film; and forming a gate electrode by using the photoresist pattern as a mask, wherein the gate cap insulating film is formed so as to include a N—H bond and substantially no Si—H bond by decomposition and deposition of a mixture of a gas including substantially no Si—H bond and a gas including a N—H bond.

2. The method according to claim 1, wherein the electrical insulating film is a silicon nitride film.

3. The method according to claim 1, wherein the gas mixture comprises a tetrachlorosilane gas and a gas including a N—H bond.

4. The method according to claim 3, wherein the gas including a N—H bond is at least one gas selected from the group consisting of ammonia, dimethylamine, hydrazine, and dimethylhydrazine.

5. The method according to claim 1, wherein the gate electrode comprises a polysilicon film implanted with boron ions, a metal film, or a laminated structure of a polysilicon film and a metal film.

6. The method according to claim 1, wherein the gate cap insulating film is formed at 700° C. to 800° C.

* * * * *